US007011141B2

(12) United States Patent
Huang et al.

(10) Patent No.: US 7,011,141 B2
(45) Date of Patent: Mar. 14, 2006

(54) APPARATUS AND METHOD FOR PRODUCING SINGLE CRYSTAL METALLIC OBJECTS

(75) Inventors: Shyh-Chin Huang, Latham, NY (US); Michael Francis X. Gigliotti, Jr., Scotia, NY (US); Stephen Francis Rutkowski, Duanesburg, NY (US); Roger John Petterson, Fultonville, NY (US); Paul Steven Svec, Scotia, NY (US)

(73) Assignee: General Electric Company, Niskayuna, NY (US)

( * ) Notice: Subject to any disclaimer, the term of this patent is extended or adjusted under 35 U.S.C. 154(b) by 120 days.

(21) Appl. No.: 10/652,906

(22) Filed: Sep. 2, 2003

(65) Prior Publication Data

US 2005/0045300 A1 Mar. 3, 2005

(51) Int. Cl.
*B22D 9/04* (2006.01)
(52) U.S. Cl. .................... 164/516; 164/122.2; 164/361
(58) Field of Classification Search ............. 164/122.1, 164/122.2, 516, 361
See application file for complete search history.

(56) References Cited

U.S. PATENT DOCUMENTS

| 3,260,505 | A |   | 7/1966  | Ver Snyder          |
|-----------|---|---|---------|---------------------|
| 3,494,709 | A |   | 2/1970  | Piearcey            |
| 3,542,120 | A | * | 11/1970 | Piearcey ..... 164/361 |
| 3,568,757 | A | * | 3/1971  | Piearcey ..... 164/353 |
| 3,572,419 | A | * | 3/1971  | Barrow et al. ..... 164/122.2 |
| 3,981,346 | A |   | 9/1976  | Hayes et al.        |
| 4,475,582 | A | * | 10/1984 | Giamei et al. ..... 164/122.2 |
| 4,549,599 | A |   | 10/1985 | Reiner et al.       |
| 4,804,311 | A |   | 2/1989  | Anderson et al.     |
| 4,940,073 | A |   | 7/1990  | Jeyarajan et al.    |
| 5,062,469 | A |   | 11/1991 | Monte et al.        |
| 6,497,272 | B1|   | 12/2002 | Maslen              |

* cited by examiner

*Primary Examiner*—Kuang Y. Lin
(74) *Attorney, Agent, or Firm*—Patrick K. Patnode; Christian G. Cabou

(57) ABSTRACT

A mold is provided for enabling casting of single crystal metallic articles including a part-defining cavity, a sorter passage positioned vertically beneath and in fluid communication with the part-defining cavity, and a seed cavity positioned vertically beneath and in fluid communication with the sorter passage. The sorter passage includes a shape suitable for encouraging a single crystal structure in solidifying molten metal. Additionally, a portion of the mold between the sorter passage and the part-defining cavity includes a notch for facilitating breakage of a cast article proximate the notch during thermal stress build-up, so as to prevent mold breakage or the inclusion of part defects.

11 Claims, 2 Drawing Sheets

APPARATUS AND METHOD FOR PRODUCING SINGLE CRYSTAL METALLIC OBJECTS

GOVERNMENT RIGHTS STATEMENT

This invention was developed through funding under Department of Energy contract DEAC05850R21400. The government may have certain rights under this Patent.

BACKGROUND OF THE INVENTION

The present invention relates generally to the field of process of forming metallic objects through directional solidification and more particularly to an optimized mold design for use in such process.

The process of directional solidification is well known in the production and manufacture of turbine elements such as rotor blades, stator vanes as well as other airfoil components having a single crystal structure. In general, the process involves providing a seed cavity at the base of the mold, wherein the restrictive shape of the pathway from the seed cavity to the part-defining cavity (sometimes referred to as the sorter or selector) encourages the formation of a single crystal structure during solidification of a molten alloy. The mold is then withdrawn from a heated environment or otherwise linearly cooled such that the propagating single crystal structure proceeds up the length of the part, thereby resulting in the entire part having this structure. Examples of conventional directional solidification processes may be found in U.S. Pat. Nos. 3,494,709, 4,940,073 and 5,062,469.

Suitable molds for use in such directional solidification processes traditionally include ceramic molds formed using the investment or "lost wax method" wherein a wax pattern having the desired shape of the mold is first formed. The wax pattern is then covered with a layer of ceramic material, from which the wax is then removed, thereby leaving a ceramic mold of the desired shape.

Unfortunately, conventional mold designs for producing gas turbine airfoils have failed to adequately provide for the substantial thermal stresses generated between the solidifying metal and the mold, resulting from inherent mismatches in thermal expansion coefficients. More specifically, exceptionally large solidification induced thermal stresses typically occur in the area between the sorter/seed assembly and the part-defining cavity. These result of such stresses often leads to premature mold failure or surface damage to the cost components.

Known efforts to address thermal stress build-up include reducing the mold withdrawal rate to thereby the build-up of such stresses. Unfortunately, this approach necessarily increases furnace cycle and overall manufacturing times. Additionally, the above approach can also result in increased metal/mold interaction times, mold bulging, and grain nucleation, each of which is disadvantageous.

Another known approach to thermal stress build-up involves the use of alternative mold materials which are better able to withstand the stresses. Unfortunately, such alternative materials introduce additional costs and complexity to the manufacturing process.

Accordingly, there is a need in the art of directional solidification for a mold design which optimally reduces the effects of thermal stresses, thereby enhancing mold life and the quality of components cast in the mold.

BRIEF SUMMARY OF THE INVENTION

Certain aspects commensurate in scope with various embodiments of the invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

Briefly, in accordance with one embodiment of the present invention, there is provided a mold for enabling casting of single crystal metallic articles including a part-defining cavity, a sorter passage positioned vertically beneath and in fluid communication with the part-defining cavity, and a seed cavity positioned vertically beneath and in fluid communication with the sorter passage. The sorter passage includes a shape suitable for encouraging a single crystal structure in solidifying molten metal. Additionally, a portion of the mold between the sorter passage and the part-defining cavity includes a notch for facilitating breakage of a cast article proximate the notch during thermal stress build-up.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF THE PREFERRED EMBODIMENTS

Figure 1:
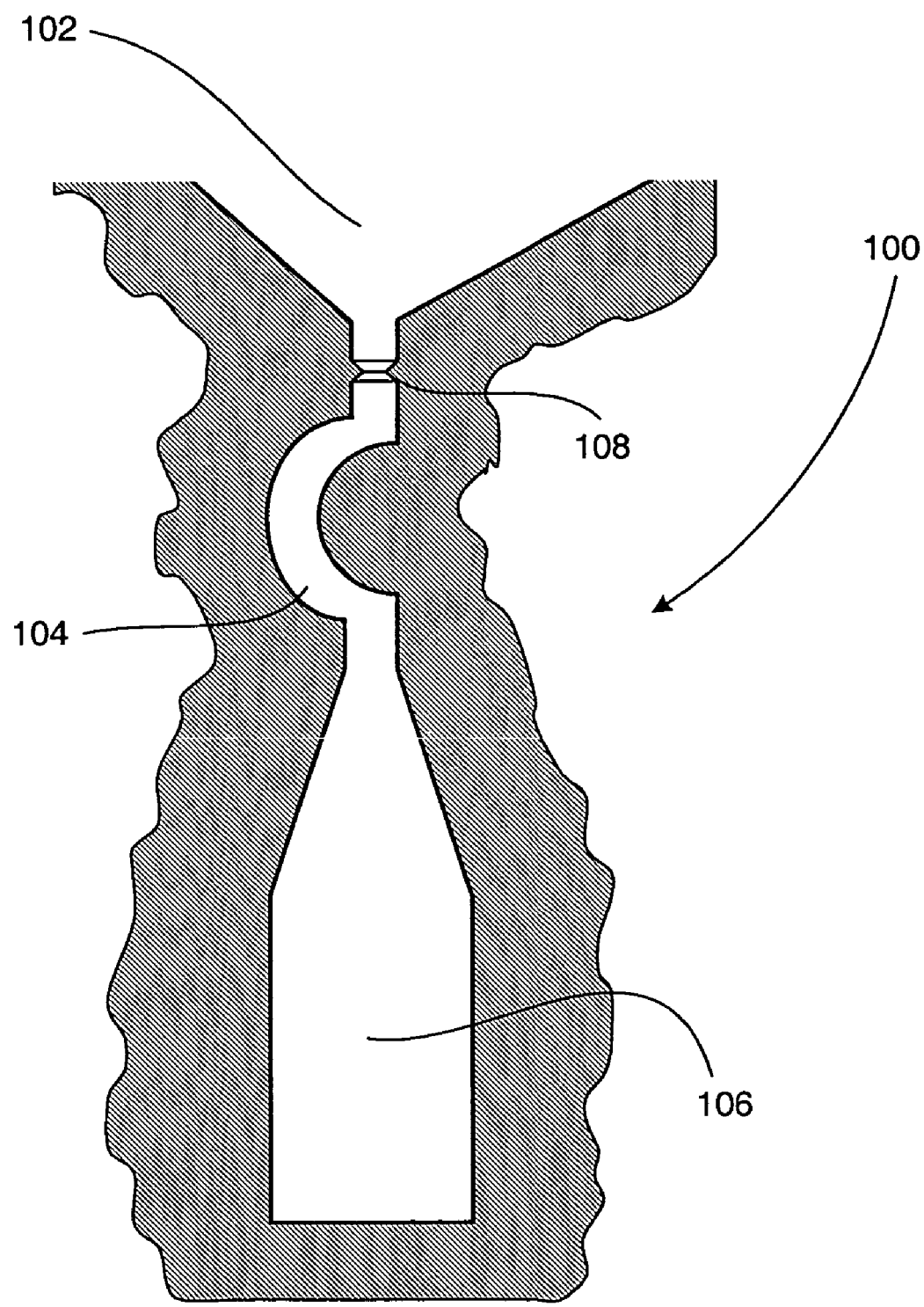
FIG. 1 is a sectional view of a portion of a mold constructed in accordance with one embodiment of the present invention.

Referring to FIG. 1, there is shown a sectional view of a portion of a mold 100 constructed in accordance with one embodiment of the present invention. The mold 100 includes a part-defining cavity 102 (the majority of which is not shown). Molten metal flows downwardly through the part-defining cavity 102 and through a sorter passage 104 and into a seed cavity 106. In one embodiment, the cross-section of the sorter passage 104 is generally cylindrical, although alternate shapes may be utilized without departing from the scope of the present invention. Upon filling with molten metal, the mold is directionally cooled, starting with the seed cavity 106. As it cools, the metal solidifies in the seed cavity 106 as a plurality of elongated grains which extend upwardly toward the sorter passage 104.

As is known in the art, upon solidification a few of the grains extend from the seed cavity 106 and into the sorter passage 104. As these grains continue to grow, it has been found that the most favorably oriented grain will grow at a greater rate than the other grains, thereby eliminating the growth of the other, less favorably-oriented grains. As the metal solidifies into the part-defining cavity 102, only a single grain is present, resulting in the desired single crystal structure.

As briefly described above, traditional mold designs fail to address thermal expansion stresses introduced between the solidifying metal and the mold during solidification which can result in premature mold failure or other casting deficiencies. Essentially, the geometry of the sorter passage 104 and the part-defining cavity 102 is such that it acts as a locking point to build up a large thermal stresses above it. If left unmanaged, the thermal stress can cause mold breakage. According to a first embodiment of the present invention, such adverse effects are reduced by constructing the portion of the mold between the sorter passage 104 and the part-defining cavity 102 to include a notch 108. The presence of notch 108 provides a stress release point in the resultant metal casting, such that the mold can remain intact without breakage.

In accordance with one embodiment of the present invention, notch 108 should be sufficiently small so as to result in breakage of the casting from the thermal stresses before such stresses can damage the mold. Conversely, the notch 108 cannot be too severe so as to restrict the flow of molten metal through the sorter passage and into the seed cavity. Additionally, a severe notch may also make the assembly and handling of the wax pattern used to form the mold more difficult.

Figure 2:
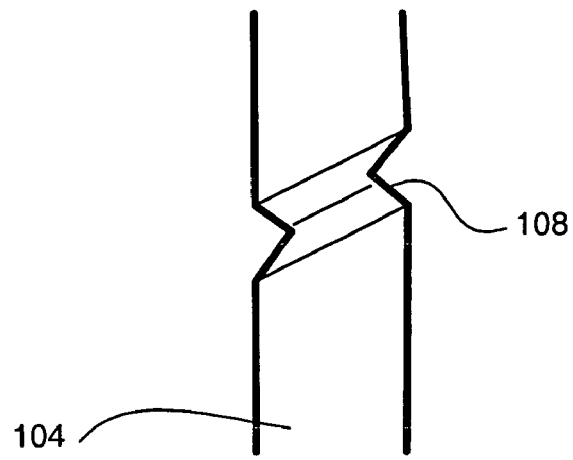
FIGS. 2 and 3 are exploded sectional views of alternate embodiments of a notch positioned in a portion of a mold between a sorter passage and a part-defining cavity.

In one embodiment, in a mold having a sorter passage with a diameter of ⅛ inch, the diameter of the circumferentially notched portion should be greater than or equal to ¹⁄₁₆ inch or half of the overall diameter of the passage. In addition to the size of the notch, the angle of the notch may also have important effects on mold performance. More particularly, it has been found that configuring the notch as a circumferential notch in the same plane as the cleavage plane of the intended single crystal orientation results in desirable breakage of the cast part. One embodiment of such an angled notch is shown in FIG. 2.

Figure 3:
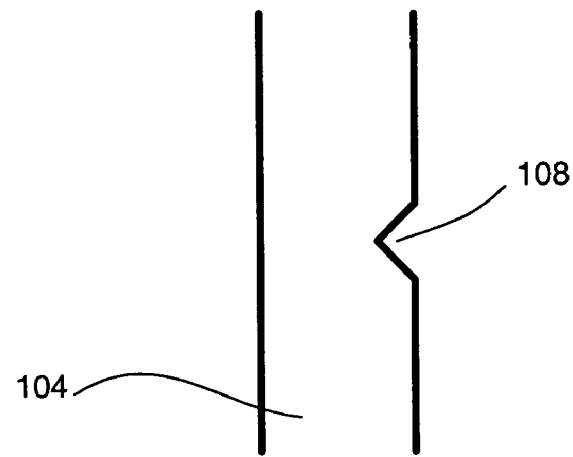

Although size and angle of the notch may effect casting breakage, notches of various shapes are complexities may be used and are within the scope of the present invention. One example of an alternate notch embodiment is shown in FIG. 3, wherein the notch 108 is simply formed on one side of the area above the sorter passage 104.

In addition to improved effectiveness, the mold design of the present invention is also easy to implement in that it does not require modification in the casting conditions or in the mold making process. Additionally, since the breakage occur in the sorter passage area, it has no undesirable effects on the cast part itself. Accordingly, no re-design of the part is necessary.

EXAMPLE

In testing the mold design of the present invention, a set of 8 casting experiments was performed to address the mold cracking problem. The experiments were performed in a directional solidification furnace cooled by liquid aluminum. More particularly, the casting configuration was a stage-1 bucket which requires the use of a seed/sorter assembly (described above) to develop a single crystal structure. It should be understood that, in the present experiment, a "bucket" is a critical airfoil component that is devised to convert the energy of the hot gas coming out of the combustor to turn rotors and generate electricity. Typically, there are three consecutive stages of bucket/rotor in a gas turbine engine, with stage-1 being the first next to the combustor. Due to the high temperature and large force that a stage-1 bucket has to endure, it is desirable to be made of a single crystal structure, particularly in advanced engines. The stage-1 bucket used in this set of experiments is about 15-inches long with complex geometry.

The molds used in the experiments were made from wax patterns with or without a notch above the sorter passage. Additionally, the molds were also made with a number of different mold reinforcement techniques. In order to show mold cracks, the metal surfaces were chemically etched after the casting runs to show the degree of reaction with aluminum resulting from mold cracks. Table 1 summarizes the mold conditions and the casting results of these experiments.

In Table 1, the term "coats" refers to the number of stucco layers used to build up the thickness of mold, and "reinforcement" refers to features added during the mold-building process. Additionally, reinforcement features used in this set of experiments further include the following elements:

(1) Tube: An alumina tube that is attached to a selected location of the mold, typically, near the trailing-edge (TE) of the bucket component. The attachment is typically done in the middle of the mold dipping process, so that the alumina tube is embedded in the wall of the finished mold.

(2) Clamshell: A half of an alumina tube embedded in the mold.

(3) Nextel: Woven cloth of alumina thread, which is applied to the mold during the mold building process by using a ceramic cement agent.

(4) Safil blanket: A blanket made of Safil fiber, which is soaked with slurry and applied to the outer surface of the mold.

(5) Graphite: Woven cloth made of graphite fiber, which is applied to the mold during the mold building process by using a ceramic cement agent.

(6) Low-density stucco: Stucco with coarse powder sizes.

TABLE 1

| LMC | Mold | Coats | Reinforcement | Notched Sorter | Fracture at Notch | Score |
|---|---|---|---|---|---|---|
| 70 | 1 | 28 | TE tube | no | — | |
| 71 | 2 | 28 | TE tube | no | — | 3 |
| 72 | 3 | 28 | TE clamshell | no | — | 4 |
| 73 | 4 | 30 | tube + clamshell + nextel + cement | no | — | 6 |
| 74 | 5 | 32 | safil blanket | yes | no | 8 |
| 75 | 6 | 30 | clamshell + nextel + graphite + safil | yes | no | 6 |
| 76 | 7 | 28 | low density stucco; safil blanket | yes | yes | 8 |
| 77 | 8 | 30 | low density stucco | yes | yes | 8 |

As shown above, four of the eight castings used molds incorporating the notch 108 of the present invention (LMC-74 to -77). Additionally, of the four notched molds, two of those four castings successfully developed breakage at the notched area (LMC-76 an -77). Additionally, these two castings corresponded to the highest surface quality score in this set of experiments. Although certain mold reinforcements appeared to also help reducing the mold crack and improving the casting surface quality, the above result indicated that an notch in the wax pattern can lead to desirable breakage in the casting, reduce the tendency of mold crack, and improve the surface quality of casting.

By providing a mold design wherein thermal stresses produced during solidification may be safely released, the mold of the present invention enables prolonged mold life and improved casting quality. While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A mold for enabling casting of single crystal metallic articles, comprising:
    a part-defining cavity;
    a sorter passage positioned vertically beneath and in fluid communication with the part-defining cavity; and
    a seed cavity positioned vertically beneath and in fluid communication with the sorter passage,
    the sorter passage including a shape suitable for encouraging a single crystal structure in solidifying molten metal, and
    wherein a portion of the mold between the sorter passage and the part-defining cavity includes a notch for facilitating breakage of a cast article proximate the notch during thermal stress build-up, the notch positioned on a plane parallel to a cleavage plane of the intended single crystal orientation.

2. The mold of claim 1, wherein the sorter passage includes a generally cylindrical cross section.

3. The mold of claim 1, wherein the notch is a circumferential notch.

4. The mold of claim 1, wherein the notch is formed in only a partial circumference of the portion of the mold between the softer passage and the part-defining cavity.

5. The mold of claim 1 wherein a diameter of the notched portion of the sorter passage is greater than or equal to one half of a diameter of the sorter passage.

6. A method of forming a mold for enabling casting of single crystal metallic articles, comprising:
    providing a pan-defining cavity for receiving molten metal to be shaped into a part;
    providing a sorter passage positioned vertically beneath and in fluid communication with the part-defining cavity, the sorter passage including a shape suitable for encouraging a single crystal structure in solidifying molten metal;
    providing a seed cavity positioned vertically beneath and in fluid communication with the sorter passage; and
    providing a notch in a portion of the mold between the sorter passage and the part-defining cavity for facilitating breakage of a cast article proximate the notch during thermal stress build-up, the notch positioned on a plane parallel to a cleavage plane of the intended single crystal orientation.

7. The method of claim 6, wherein the sorter passage includes a generally cylindrical cross section.

8. The method of claim 6, wherein the notch is a circumferential notch.

9. The method of claim 6, wherein the notch is formed in only a partial circumference of the portion of the mold between the sorter passage and the part-defining cavity.

10. The method of claim 6, wherein a diameter of the notched portion of the sorter passage is greater than or equal to one half of a diameter of the sorter passage.

11. A mold for enabling casting of single crystal metallic articles, comprising:
    a part-defining cavity;
    a sorter passage positioned vertically beneath and in fluid communication with the part-defining cavity; and
    a seed cavity positioned vertically beneath and in fluid communication with the sorter passage,
    the sorter passage having a substantially circular cross section and including a shape suitable for encouraging a single crystal structure in solidifying molten metal, and
    wherein a portion of the mold between the sorter passage and the part-defining cavity includes a circumferential notch therein for facilitating breakage of a cast article proximate the notch upon thermal stress build-up during solidification, the notch positioned on a plane parallel to a cleavage plane of the intended single crystal orientation.

* * * * *